United States Patent
Park

(10) Patent No.: US 9,030,878 B2
(45) Date of Patent: May 12, 2015

(54) SEMICONDUCTOR MEMORY DEVICE INCLUDING A PLURALITY OF CELL STRINGS, MEMORY SYSTEM INCLUDING THE SAME, AND CONTROL METHOD THEREOF

(71) Applicant: Jin Su Park, Icheon-si (KR)

(72) Inventor: Jin Su Park, Icheon-si (KR)

(73) Assignee: SK Hynix Inc., Icheon-Si, Gyeonggi-Do (KR)

(*) Notice: Subject to any disclaimer, the term of this patent is extended or adjusted under 35 U.S.C. 154(b) by 223 days.

(21) Appl. No.: 13/718,261

(22) Filed: Dec. 18, 2012

(65) Prior Publication Data

US 2013/0294165 A1    Nov. 7, 2013

(30) Foreign Application Priority Data

May 3, 2012   (KR) .................. 10-2012-0046687

(51) Int. Cl.
| | |
|---|---|
| G11C 16/04 | (2006.01) |
| G11C 16/28 | (2006.01) |
| G11C 16/10 | (2006.01) |
| G11C 16/24 | (2006.01) |
| G11C 16/26 | (2006.01) |

(52) U.S. Cl.
CPC ............ *G11C 16/04* (2013.01); *G11C 16/0483* (2013.01); *G11C 16/28* (2013.01); *G11C 16/10* (2013.01); *G11C 16/24* (2013.01); *G11C 16/26* (2013.01)

(58) Field of Classification Search
CPC ............................ G11C 16/0483; G11C 16/28
USPC .......................................... 365/185.17, 185.2
See application file for complete search history.

(56) References Cited

U.S. PATENT DOCUMENTS

| | | | |
|---|---|---|---|
| 5,088,066 A | 2/1992 | Castro | |
| 5,136,544 A | 8/1992 | Rozman et al. | |
| 5,377,147 A | 12/1994 | Merchant et al. | |
| 6,166,938 A | 12/2000 | Wong | |
| 6,256,216 B1 | 7/2001 | Lien et al. | |
| 6,256,702 B1* | 7/2001 | Yoneyama | 711/103 |
| 6,381,163 B1 | 4/2002 | Kurihara et al. | |
| 6,927,999 B2* | 8/2005 | Sim et al. | 365/185.2 |
| 7,151,682 B2 | 12/2006 | Haid et al. | |
| 7,239,556 B2* | 7/2007 | Abe et al. | 365/185.33 |
| 7,307,894 B2 | 12/2007 | Kido et al. | |
| 7,328,301 B2 | 2/2008 | Eilert et al. | |
| 7,336,516 B2 | 2/2008 | Tran et al. | |
| 7,610,479 B2* | 10/2009 | May et al. | 713/2 |
| 7,835,187 B2 | 11/2010 | Tamada et al. | |
| 8,023,341 B2 | 9/2011 | Kawabata et al. | |
| 8,379,456 B2* | 2/2013 | Park et al. | 365/185.22 |
| 8,514,624 B2* | 8/2013 | Parat et al. | 365/185.17 |
| 2010/0328979 A1 | 12/2010 | Park | |

FOREIGN PATENT DOCUMENTS

| | | |
|---|---|---|
| KR | 10-2010-0013187 | 2/2010 |
| KR | 10-2010-0098145 | 9/2010 |

* cited by examiner

*Primary Examiner* — Vanthu Nguyen
(74) *Attorney, Agent, or Firm* — Lowe Hauptman & Ham, LLP

(57) ABSTRACT

A semiconductor memory device includes first cell strings connected to first bit lines and second cell strings connected to second bit lines corresponding to the first bit lines, respectively. Data is stored in memory cells of the first cell strings, and the second cell strings are configured as a data non-storage region. At least one memory cell of each of the second cell strings is in a programmed state.

21 Claims, 12 Drawing Sheets

FIG. 3

BLK1

| EPn | OPn |
|---|---|
| EPn-1 | OPn-1 |

⋮

| EP4 | OP4 |
|---|---|
| EP3(data-stored page) | OP3 |
| EP2 | OP2 |
| EP1 | OP1 | data storage region | data non-storage region

FIG. 10

BLK1

| EPn | OPn |
|---|---|
| EPn-1 | OPn-1 |

⋮

| EP4<br>(page storing duplicated data) | OP4 |
|---|---|
| EP3<br>(page storing data) | OP3 |
| EP2<br>(page storing duplicated data) | OP2 |
| EP1 | OP1 | data storage region     data non-storage region

US 9,030,878 B2

SEMICONDUCTOR MEMORY DEVICE INCLUDING A PLURALITY OF CELL STRINGS, MEMORY SYSTEM INCLUDING THE SAME, AND CONTROL METHOD THEREOF

CROSS-REFERENCE TO RELATED APPLICATION

Priority is claimed to Korean patent application number 10-2012-0046687 filed on May 3, 2012, the entire disclosure of which is incorporated herein by reference in its entirety.

BACKGROUND

This disclosure is related to a semiconductor memory device, a memory system including the same and an operating method thereof.

A semiconductor memory is a storage device implemented by using silicon (Si), germanium (Ge), gallium arsenide (GaAs), indium phosphide (InP), or the like. A semiconductor memory is classified into a volatile memory and a nonvolatile memory.

A volatile memory is a memory device that retains data which is lost when power supply is off or interrupted. Examples of a volatile memory include a static RAM (SRAM), a dynamic RAM (DRAM), a synchronous DRAM (SDRAM), and the like. A non-volatile memory is a memory device that retains data stored therein even when power supply is off or interrupted. Examples of a non-volatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. A flash memory is classified into a NOR type memory and a NAND type memory.

SUMMARY

A semiconductor memory device according to at least one embodiment of the present invention includes: first cell strings connected to first bit lines, and second cell strings connected to second bit lines corresponding to the first bit lines, respectively. Memory cells of the first cell strings store data. The second cell strings are maintained as a data non-storage region. At least one memory cell of each of the second cell strings is in a programmed state.

A memory system according to at least one embodiment of the present invention includes a semiconductor memory device and a controller. The semiconductor memory device includes first cell strings connected to first bit lines and second cell strings connected to second bit lines corresponding to the first bit lines, respectively. The controller is configured to access data stored in memory cells of the first cell strings and to maintain the second cell strings as a data non-storage region. At least one memory cell of each of the second cell strings is in a programmed state.

An control method of a semiconductor memory device according to at least one embodiment of the present invention is provided. The semiconductor memory device includes first bit lines and second bit lines corresponding to the first bit lines, respectively. The method comprises storing data in first cell strings connected to the first bit lines, and performing programming on at least one memory cell of each of the second cell strings connected to the second bit lines. The second cell strings are maintained as a data non-storage region.

BRIEF DESCRIPTION OF THE DRAWINGS

FIG. 3 is a conceptual view illustrating an exemplary embodiment of storing data in memory pages included in a meta memory block;

FIG. 10 is a conceptual view illustrating another exemplary embodiment of storing data in memory pages included in the meta memory block;

DESCRIPTION OF EMBODIMENTS

Various advantages, features, and methods for achieving them will be described through embodiments hereinafter in conjunction with accompanying drawings. However, the present invention may be embodied in different forms, without being limited to those described hereinafter. The embodiments are provided in detail for a person skilled in the art to implement the technical concept disclosed herein.

It will be understood that when an element is referred to as being "connected to" another element, it can be directly connected to the other element or intervening elements may also be present. In contrast, when an element is referred to as being "directly connected to" another element, no intervening elements are present. In addition, unless explicitly described to the contrary, the word "comprise" and variations such as "comprises" or "comprising" will be understood to imply the inclusion of stated elements, without excluding any other elements.

Figure 1:
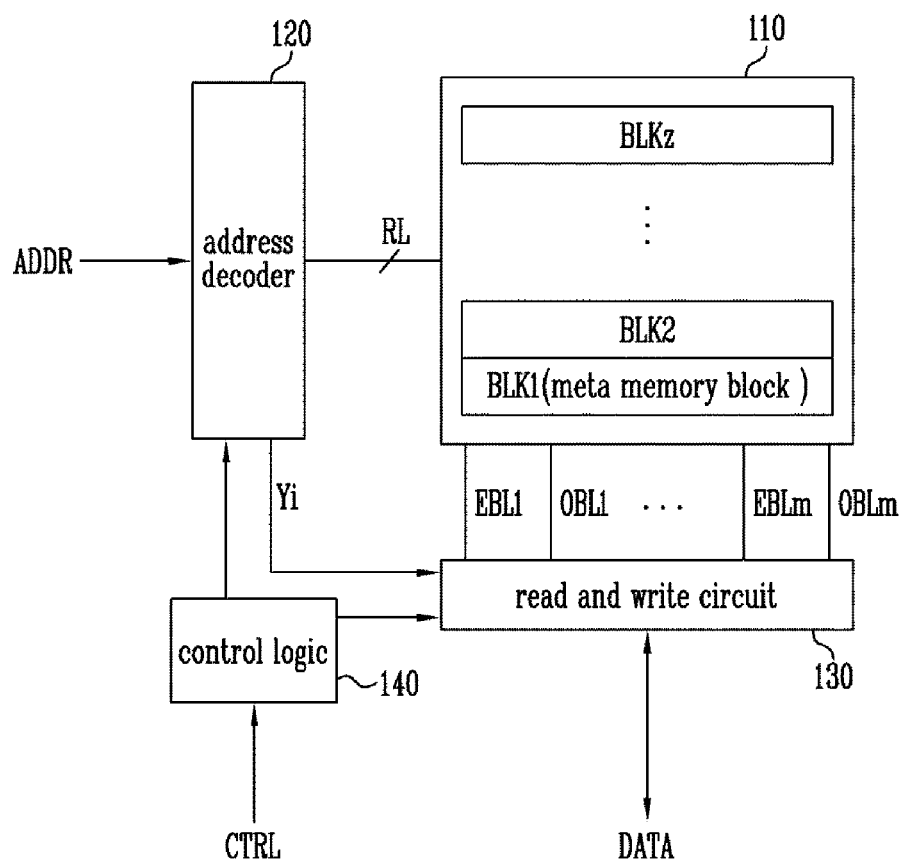
FIG. 1 is a block diagram of a semiconductor memory device according to at least one embodiment of the present invention.

FIG. 1 is a block diagram of a semiconductor memory device according to at least one embodiment of the present invention.

Referring to FIG. 1, the semiconductor memory device 100 includes a memory cell array 110, an address decoder 120, a read and write circuit 130, and a control logic 140.

The memory cell array 110 is connected to the address decoder 120 through row lines RL. The memory cell array 110 is connected to the read and write circuit 130 through first bit lines and second bit lines corresponding to the first bit lines, respectively. In an exemplary embodiment, the first bit lines may be even bit lines EBL1~EBLm and the second bit lines may be odd bit lines OBL1~OBLm. In another exemplary embodiment, the first bit lines may be odd bit lines OBL1~OBLm and the second bit lines may be even bit lines EBL1~EBLm. Other arrangements of the first bit lines relative to the second bit lines are within the scope of this disclosure.

The memory cell array 110 includes a plurality of memory blocks BLK1~BLKz. Each of the plurality of memory blocks BLK1~BLKz includes a plurality of memory cells. In an exemplary embodiment, the plurality of memory cells may be non-volatile memory cells. In at least one embodiment, the memory cells are multi-level cells (MLC) each configured to store 2 bits or more.

At least one memory block BLK1 of the plurality of memory blocks BLK1~BLKz may be a meta memory block, and the other remaining memory blocks BLK2~BLKz may be normal memory blocks. The normal memory blocks are data blocks from which data is read by using a normal read operation. The meta memory block BLK1 is a data block storing special data (or meta data), from which meta data is read by using a fast read operation faster than the normal read operation.

In an exemplary embodiment, data for managing operation of the semiconductor memory device 100 may be stored as meta data in the meta memory block BLK1. Examples of meta data include, but are not limited to, various management data such as initialization information, operation bias information, operation timing information, bad block information, repair information, electrical fuse (e-fuse) information, and the like, of the semiconductor memory device 100. Such meta data may be stored in the meta memory block BLK1 in a testing stage after the semiconductor memory device 100 is manufactured. In an exemplary embodiment, the meta memory block BLK1 may be a hidden memory block that may not be accessed from outside the semiconductor memory device 100.

The memory cells arranged in a row direction are connected to word lines among row lines RL. The memory cells arranged in a column direction are connected to the even bit lines EBL1~EBm and odd bit lines OBL1~OBm. For example, memory cells disposed in a column form a single cell string, and each cell string is connected to one bit line.

A program operation and read operation of the semiconductor memory device 100 may be performed by memory pages. An erasing operation of the semiconductor memory device 100 may be performed by memory blocks.

The address decoder 120 is connected to the memory cell array 110 through the row lines RL. The address decoder 120 is configured to operate under the control of the control logic 140. The address decoder 120 receives addresses ADDR from an input/output buffer (not shown) within the semiconductor memory device 100 or from external circuitry.

The address decoder 120 is configured to decode block addresses among the received addresses ADDR. The address decoder 120 selects at least one memory block according to the decoded block address.

The address decoder 120 is configured to decode row addresses among the received addresses ADDR. The address decoder 120 selects one word line by controlling voltages of the row lines RL according to the decoded row addresses.

The address decoder 120 may decode column addresses among the received addresses ADDR and transmit the decoded column addresses Yi to the read and write circuit 130.

In an exemplary embodiment, the address decoder 120 may include a block decoder, a row decoder, a column decoder, an address buffer, and the like.

The read and write circuit 130 is connected to the memory cell array 110 through the even bit lines EBL1~EBLm and odd bit lines OBL1~OBm. The read and write circuit 130 operates under the control of the control logic 140.

The read and write circuit 130 exchanges data DATA with the input/output buffer (not shown) of the semiconductor memory device 100 or external circuitry. In case of programming, the read and write circuit 130 receives data DATA and programs the received data DATA in memory cells connected to selected word lines. During a read operation, the read and write circuit 130 precharges the even bit lines EBL1~EBm and the odd bit lines OBL1~OBm, senses a change (or an absence thereof) in a voltage of each of selected bit lines EBL1~EBm or OBL1~OBm to thereby read data of selected memory cells, and output data DATA corresponding to a decoded column address Yi among the read data.

The read and write circuit 130 may include memory page buffers (or page registers) and a column selection circuit, or the like.

The control logic 140 is electrically connected to the address decoder 120 and the read and write circuit 130. The control logic 140 may be configured to control operation of the semiconductor memory device 100. The control logical 140 may be configured to control the address decoder 120 and the read and write circuit 130 in response to a control signal CTRL.

The semiconductor memory device 100 may further include an input/output circuit (not shown). The input/output circuit may operate under the control of the control logic 140. The input/output circuit may receive the control signal CTRL and the address ADDR from external circuitry and transfer the received control signal CTRL and the address ADDR to the control logic 140 and the address decoder 120, respectively. Also, the input/output circuit may be configured to transfer the data DATA from external circuitry to the read and write circuit 130, and transfer data DATA from the read and write circuit 130 to external circuitry. Also, the semiconductor memory device 100 may further include a high voltage generator (not shown). The high voltage generator may operate under the control of the control logic 140. The high voltage generator may include a plurality of pumping capacitors, and may be configured to generate a high voltage by using a power source voltage supplied to the semiconductor memory device 100.

In an exemplary embodiment, the semiconductor memory device may be a flash memory.

Figure 2:
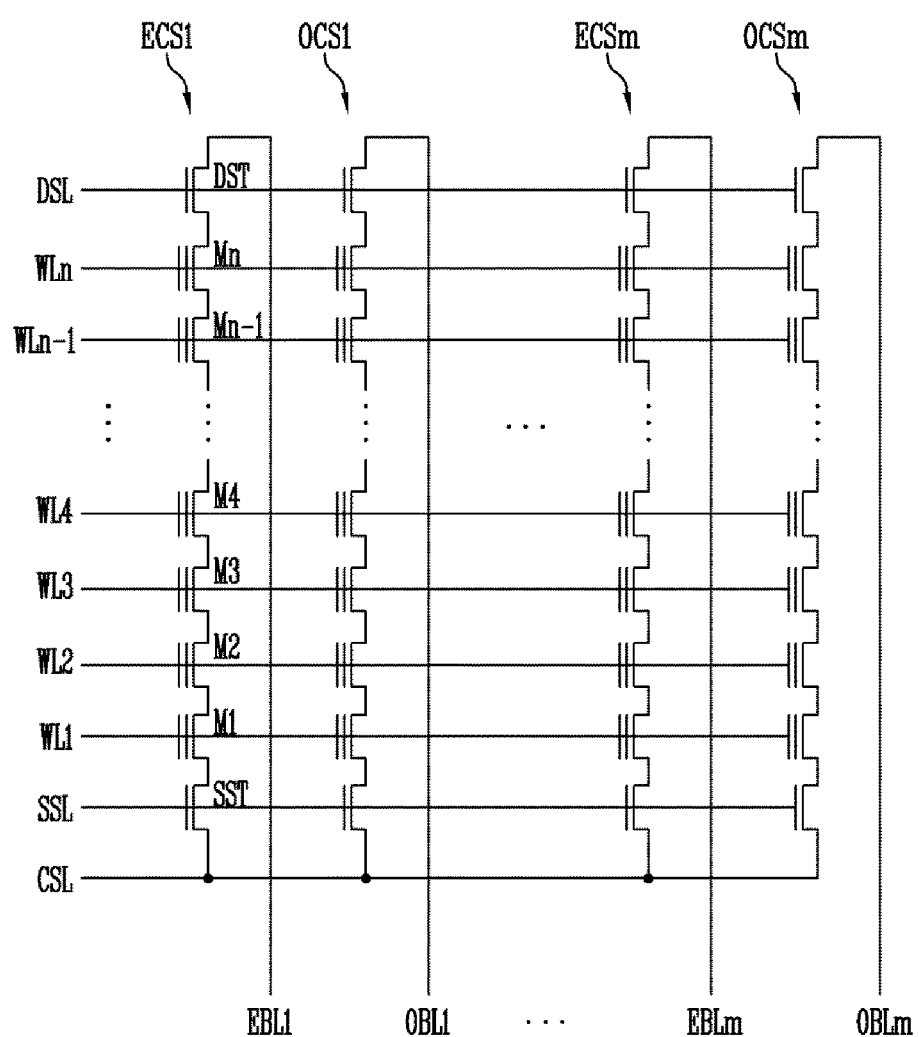
FIG. 2 is a circuit diagram of one of memory blocks shown in FIG. 1.

FIG. 2 is a circuit diagram showing one memory block BLK1 among the memory blocks BLK1~BLKz of FIG. 1. Hereinafter, the first memory block BLK1 will be described with reference to FIG. 2, but the other memory blocks BLK2~BLKz may also have the same configuration.

Referring to FIGS. 1 and 2, the memory block BLK1 is connected to the read and write circuit 130 through the first to mth even bit lines EBL1~EBLm and the first to mth odd bit lines OBL1~OBLm. The memory block BLK1 is connected to the address decoder through a common source line CSL, a source selection line SSL, first to nth word lines WL1~WLn, and a drain selection line DSL. The row lines RL in FIG. 1 includes the common source line CSL, the source selection line SSL, the first to nth word lines WL1~WLn, and the drain selection line DSL.

The memory block BLK includes a plurality of cell strings ECS1~ECSm and OCS1~OCSm. Even cell strings ECS1~ECSm are connected to first to mth even bit lines EBL1~EBLm, respectively. Odd cell strings OCS1~OCSm are connected to the first to mth odd bit lines OBL1~OBLm, respectively. Each cell string includes a source selection transistor SST connected to the source selection line SSL, first to mth memory cells connected to the first to nth word lines WL1~WLn, and a drain selection transistor DST connected to the drain selection line DST. The source selection transistor of each cell string is connected to the common source line CSL.

Memory cells of the even cell strings ECS1~ECSm connected to one word line constitute at least one memory page. For example, when the memory cells are single level cells, memory cells of the even cell strings ECS1~ECSm connected to one word line may constitute one memory page. For example, when the memory cells are multi-level cells, memory cells of the even cell strings ECS1~ECSm connected to one word line may constitute two or more memory pages.

Similarly, memory cells of the odd cell strings OCS1~OCSm connected to one word line constitute at least one memory page.

Hereinafter, a memory page comprised of memory cells of the even cell strings ECS1~ECSm connected to one word line is defined as an even memory page. Also, a memory page comprised of memory cells of the odd cell strings OCS1~OCSm connected to one word line is defined as an odd memory page.

Hereinafter, it is assumed that memory cells of the memory cell array 110 are single level cells for the description purpose. However, further embodiments are applicable to multi-level cells.

FIG. 3 is a conceptual view illustrating an exemplary embodiment of storing data in memory pages EP1~EPn and OP1~OPn included in the meta memory block BLK1.

Referring to FIG. 3, in some embodiments, only even memory pages EP1~EPn or odd memory pages OP1~OPn of the meta memory block BLK1 may be used as data storage regions. For example, as illustrated in FIG. 3, the even memory pages EP1~EPn are managed as data storage regions, while the odd memory pages OP1~OPn may be maintained as a data non-storage region. Data is stored in the memory cells of the even cell strings ECS1~ECSm (FIG. 2) connected to at least one word line, and the odd cell strings OCS1~OCSm (FIG. 2) may be maintained as a data non-storage region.

In an exemplary embodiment, data may be stored in only one memory page of the meta memory block BLK1. Hereinafter, it is assumed that data is stored only in a third memory page EP3 among the even memory pages EP1~EPn as illustrated in FIG. 3.

Figure 4:
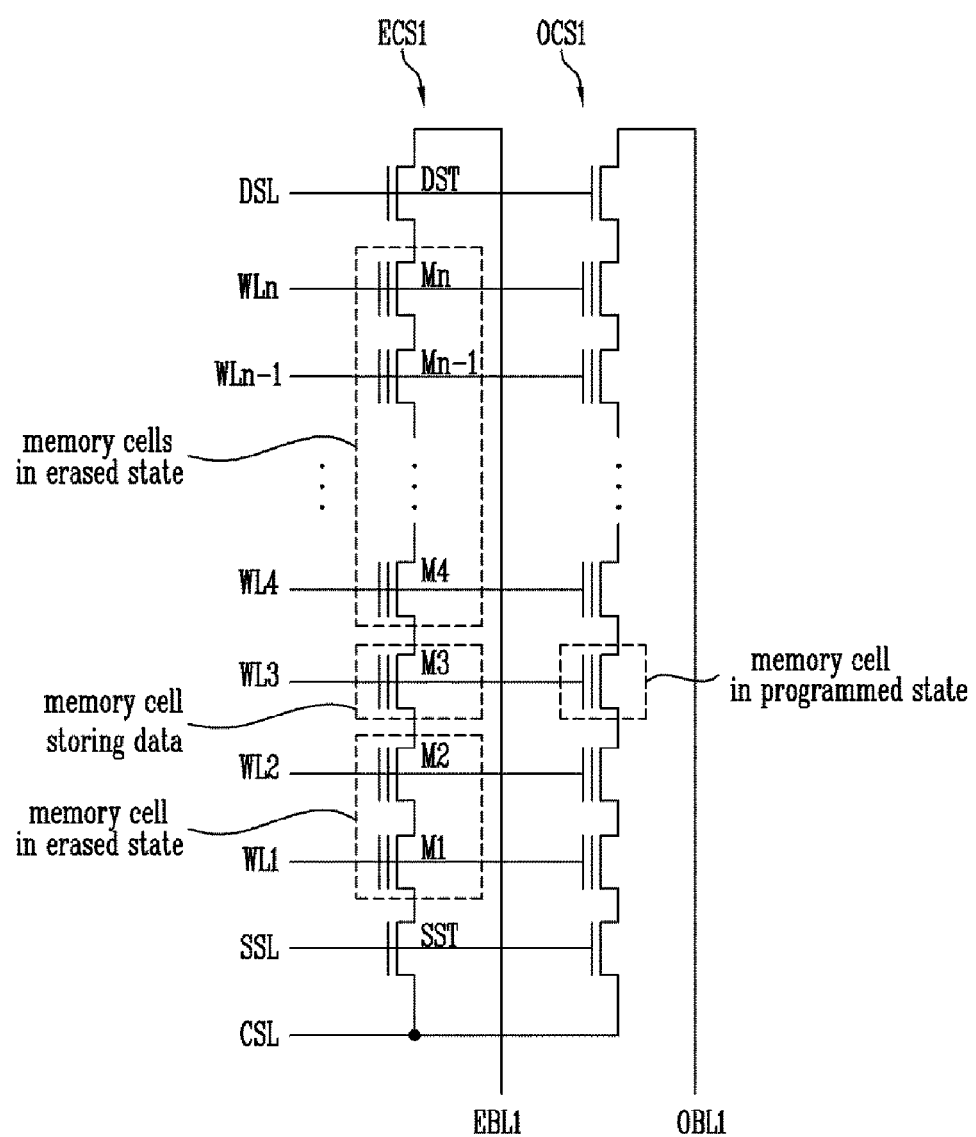
FIG. 4 is a view illustrating states of memory cells included in an even cell string and an odd cell string according to at least one embodiment of the present invention.

FIG. 4 is a view illustrating states of memory cells included in the even cell string ECS1 and odd cell string OCS1 according to at least one embodiment of the present invention.

Referring to FIGS. 2 to 4, storing data in the third memory page EP3 includes storing data in a third memory cell M3 among the memory cells M1~Mn of an even cell string, for example, ECS1. A threshold voltage of the third memory cell M3 may be determined according to data stored in the third memory cell M3. For example, when the third memory cell M3 stores "1", the threshold voltage of the third memory cell M3 is lower than when the third memory cell M3 stores "0".

Data is not stored in the other remaining even memory pages EP1, EP2, and EP4~EPn, excluding the third even memory page EP3. Thus, the first and second memory cells M1 and M2 and the fourth to nth memory cells M4~Mn remain as empty spaces (namely, spaces in which data is not stored). In an exemplary embodiment, the first and second memory cells M1 and M2 and the fourth to nth memory cells M4~Mn may have a threshold voltage of a memory cell in an erased state.

According to at least one embodiment of the present invention, the odd cell string OCS1 is maintained as a data non-storage region and includes at least one memory cell in a programmed state. The at least one memory cell in the programmed state stores data which, in at least one embodiment, is dummy data that has no purposes other than to place the memory cell in the programmed state. In at least one embodiment, the data non-storage region includes memory cells that are either empty (i.e., in the erased stated) or contain dummy data (i.e., in a programmed state). In at least one embodiment, after the programming of dummy data in the memory cells of the data non-storage region has been completed, the data non-storage region is inaccessible from outside the semiconductor memory device 100 by appropriately configuring one or more of the address decoder 120, the read and write circuit 130, or the control logic 140.

FIG. 4 illustrates that the memory cell in the programmed state is connected to the same word line to which the third memory cell M3 of the even cell string ECS1 is connected. However, this is merely illustrative and the memory cell in the programmed state may be connected to a word line different from that to which the third memory cell M3 of the even cell string ECS1 is connected.

Figure 5:
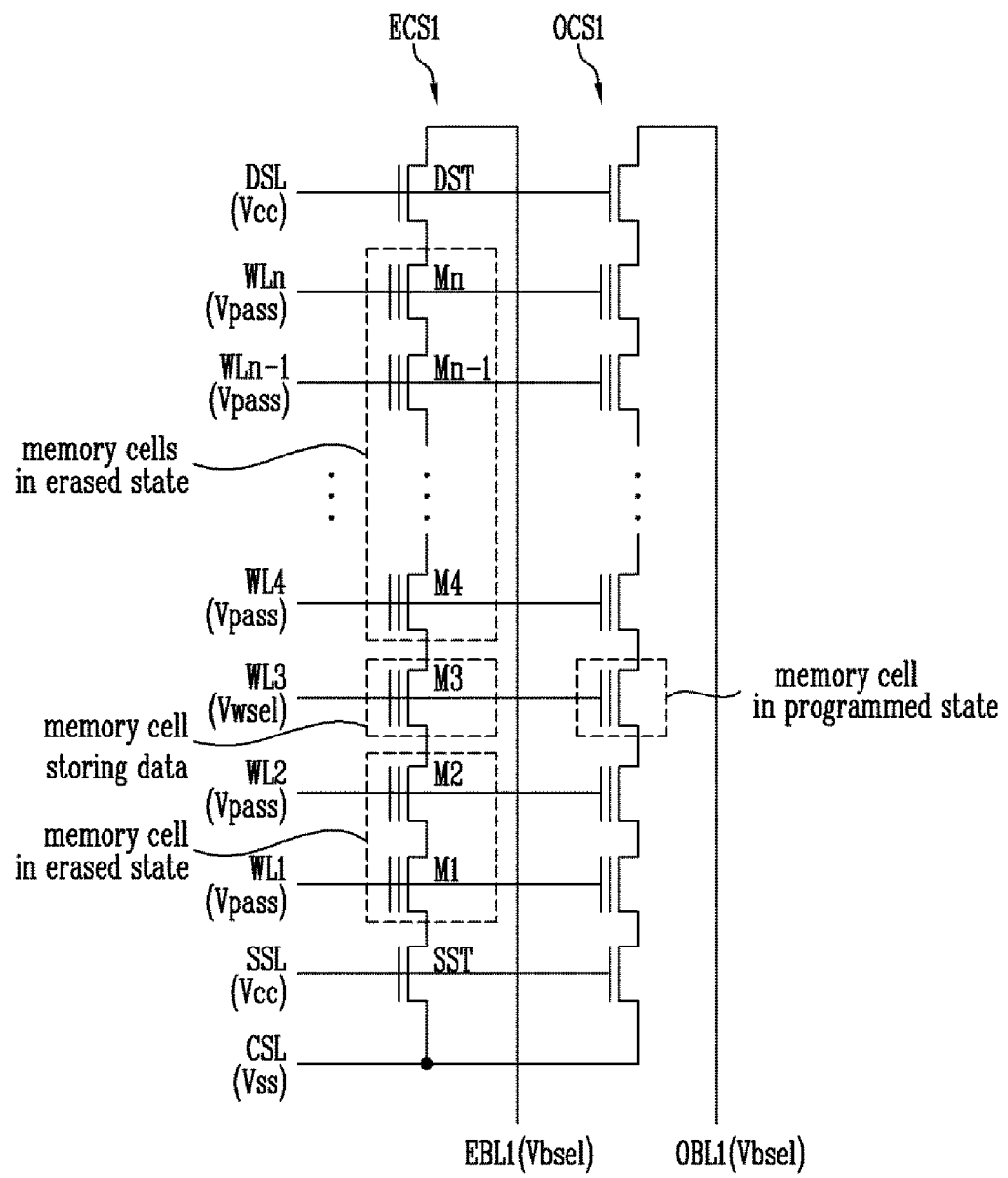
FIG. 5 is a view illustrating voltages applied to the even cell string and the odd cell string of FIG. 4 during a read operation.

FIG. 5 is a view illustrating voltages applied to the even cell string and the odd cell string of FIG. 4 during a read operation.

In the following description with reference to FIG. 5, it is assumed that the third even memory page EP3 (FIG. 3) is selected. Also, it is assumed that the even bit lines EBL1~EBm (FIG. 2) are selected bit lines. Namely, during a read operation, data stored in the third even memory page EP3 may be read through the even bit lines EBL1~EBm.

Referring to FIG. 5, a reference voltage Vss (e.g., a ground voltage) is applied to the common source line (CSL), and a power source voltage Vcc is applied to the source selection line (SSL). A pass voltage Vpass (also referred to herein as "low pass voltage Vpass") is applied to unselected word lines WL1, WL2, and WL4~WLn, and a word line selection voltage Vwsel is applied to the selected word line WL3. The power source voltage Vcc is applied to the drain selection line DSL.

In an exemplary embodiment, the pass voltage Vpass applied to the unselected word lines WL1, WL2, and WL4~WLn may be a low voltage. For example, the pass voltage Vpass may be a power source voltage Vcc or a voltage between the reference voltage and the power source voltage Vcc. In at least one embodiment, the low pass voltage Vpass is sufficient to turn on a memory cell in an erased state and to turn off a memory cell in a programmed state.

Memory cells connected to the unselected word lines WL1, WL2, and WL4~WLn of the even cell strings ESC1 are in an erased state. The memory cells connected to the unselected word lines WL1, WL2, and WL4~WLn of the even cell strings ESC1 may be turned on by the low pass voltage Vpass. Since the low pass voltage Vpass, rather than a high pass voltage (e.g., 5V), is used, a loading time required for the low pass voltage Vpass to increase and reach a target voltage thereof may be reduced.

The word line selection voltage Vwsel (e.g., the reference voltage Vss) is applied to the selected word line WL3. The third memory cell M3 may be turned on or turned off according to data stored in the third memory cell M3. In at least one embodiment, the word line selection voltage Vwsel is sufficient to turn on a memory cell in an erased state and to turn off a memory cell in a programmed state. In some embodiments, the word line selection voltage Vwsel is from -------------V to ----------V.

When the third memory cell M3 is turned on, charges precharged in the even bit line EBL1 may flow to the common source line CSL through the even cell string EBL1. When the third memory cell M3 is turned off, charges precharged in the even bit line EBL1 may not flow through the even cell string EBL1. The read and write circuit 130 (FIG. 1) may determine (or detect) data of the third memory cell M3 by sensing a voltage of the even bit line EBL1.

According to at least one embodiment of the present invention, during a read operation, the selected bit line EBL1 and unselected bit line OBL1 adjacent the selected bit line EBL1 are all precharged with a bit line selection voltage Vbsel. Although it is not illustrated in FIG. 5, the remaining bit lines EBL2~EBm and OBL2~OBm are also precharged with the bit line selection voltage Vbsel. In some embodiments, the bit line selection voltage Vbsel is the power source voltage Vcc.

It is assume that the odd bit line OBL1 is set by the reference voltage Vss, rather than the bit line selection voltage Vbsel, when the even bit line EBL1 is precharged with the bit line selection voltage Vbsel. In such a situation, a precharge speed of the even bit line EBL1 may be reduced due to a difference between the voltage of the even bit line EBL1 and that of the odd bit line OBL1. By precharging the selected bit line EBL1 and the adjacent unselected bit line OBL1 with the same voltage (e.g., the bit line selection voltage Vbsel), the precharge speed of the selected bit line EBL1 can be increased.

According to at least one embodiment of the present invention, the even bit lines EBL1~EBm (FIG. 2) and the odd bit lines OBL1~OBm (FIG. 2) are precharged by the same voltage (bit line selection voltage Vbsel), so that the precharge speed of the bit lines can be increased.

Meanwhile, it is assumed that the memory cells of the odd cell string OCS1 are in an erased state. Threshold voltages of the memory cells of the odd cell strings OCS1 connected to the unselected word lines WL1, WL2, and WL4~WLn may be lower than the pass voltage Vpass. Also, a threshold voltage of the memory cell of the odd cell string OCS1 connected to the selected word line WL3 may be lower than the word line selection voltage Vwsel. All the memory cells of the odd cell string OCS1 may be turned on. When the odd bit line OBL1 is precharged with the bit line selection voltage Vbsel, the charges precharged in the odd bit line OBL1 may flow out to the common source line CSI through the odd cell string OCS1. In such a situation, the amount of current consumed during the read operation may be increased.

According to at least one embodiment of the present invention, the odd cell string OCS1 includes at least one memory cell in a programmed state. For example, a memory cell of the odd cell string OCS1 connected to the third word line WL3 may be a memory cell in a programmed state. When the word line selection voltage Vwsel is applied to the third word line WL3, the memory cell in the programmed state (which has a higher threshold voltage than in the erased state) may be turned off. Charges precharged in the odd bit line OBL1 may not flow out through the odd cell string OSC1. Thus, the amount of current consumed during the read operation may be reduced and the precharge speed of bit lines may be increased.

In another example, a memory cell of the odd cell string OCS1 connected to a word line (e.g., WL2), other than the third word line WL3, may be a memory cell in a programmed state. When the pass voltage Vpass is applied to the different word line (e.g., WL2), since the pass voltage Vpass is a low voltage as described above, the memory cell in the programmed state may be turned off. Thus, the charged precharged in the odd bit line OBL1 may not flow out through the odd cell string OCS1.

According to at least one embodiment of the present invention, the even bit lines and the odd bit lines are precharged by the same voltage during the read operation. The precharge speed of the bit lines may be enhanced. Thus, the semiconductor memory device 100 having an enhanced read operation speed can be provided.

Figure 6:
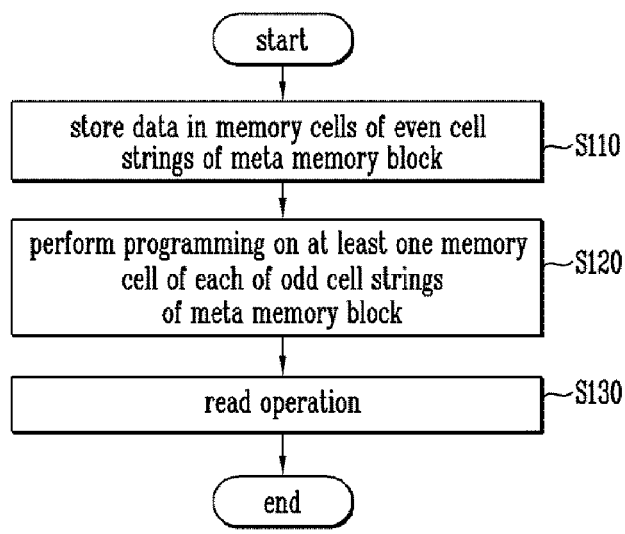
FIG. 6 is a flow chart illustrating an operating method of a semiconductor memory device according to at least one embodiment of the present invention.

FIG. 6 is a flow chart illustrating an operating method of a semiconductor memory device according to at least one embodiment of the present invention.

Referring to FIGS. 1, 2, 5, and 6, in step S110, data is stored in the memory cells of the even cell strings ECS1~ECSm of the meta memory block BLK1. For example, data may be stored in only one memory page of the even cell strings ECS1~ECSm.

In step S120, programming is performed on at least one memory cell of each of the odd cell strings OCS1~OCSm of the meta memory block BLK1. Since programming is performed on at least one memory cell of each of the odd cell string OCS1~OCSm, although each odd bit line is precharged with the bit line selection voltage Vbsel during the read operation, precharged charges may not be discharged.

Steps S110 and S120 may be performed in a testing stage after the semiconductor memory device is manufactured. In an exemplary embodiment, the meta memory block BLK1 may be a one time programmed (OTP) block which is programmed one time and programmed data thereof is not altered.

The order of steps S110 and S120 may be altered in some embodiments.

In step S130, a read operation is performed. The read operation in step S130 may be, for example, an operation for initializing the semiconductor memory device 100 when power is turned on.

Figure 7:
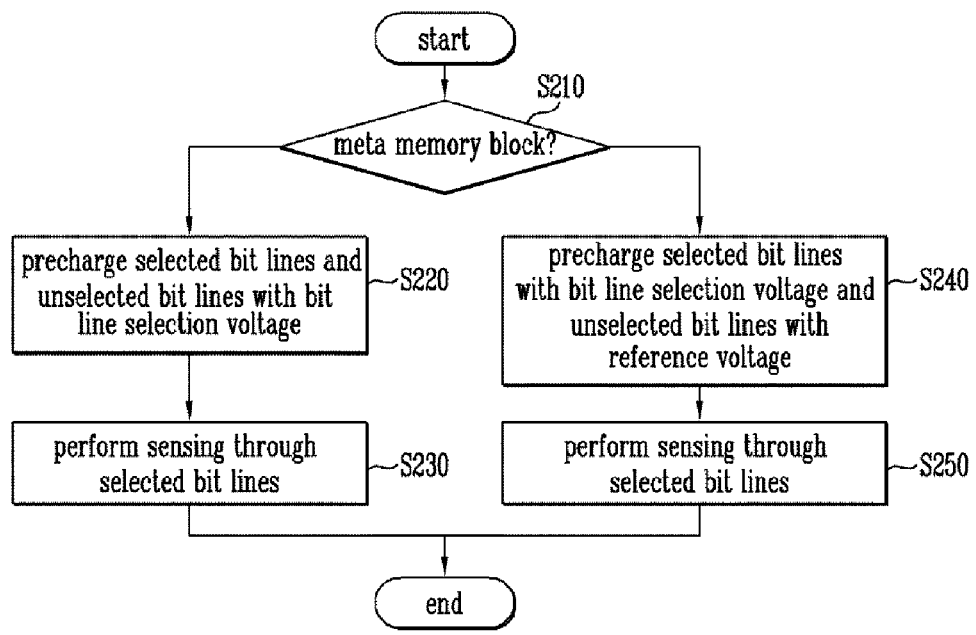
FIG. 7 is a flow chart specifically illustrating step S130 in FIG. 6.

FIG. 7 is a flow chart specifically illustrating step S130 in FIG. 6.

Referring to FIGS. 1, 2, 5, and 7, in step S130, whether or not a generated read request is a read request for meta memory block BLK1 is discriminated. When the generated read request is a read request for the meta memory block BLK1, step S220 is performed. When the generated read request is not a read request for the meta memory block BLK1, step S240 is performed.

In step S220, selected bit lines (e.g., EBL1~EBm) and unselected bit lines (e.g., OBL1~OBm) are precharged with the bit line selection voltage Vbsel. A precharge speed in step S220 is faster than that of step S240. Thus, a read speed with respect to the meta memory block BLK1 is faster than that with respect to a normal memory block.

The word line selection voltage Vwsel is applied to the selected word line (e.g., WL3), and the pass voltage Vpass may be applied to the unselected word lines (e.g., WL1, WL2, and WL4~WLn).

In step S230, a sensing operation is performed through the selected bit lines. The read and write circuit 130 senses a voltage of the selected bit lines to discriminate data of selected memory cells.

In step S240, during a read operation with respect to a normal memory block, the selected bit lines are precharged with the bit line selection voltage Vbsel, and the unselected bit lines are precharged by the reference voltage. As discussed above, the difference in the voltages applied to the selected and adjacent unselected bit lines reduces the precharge speed. Therefore, the precharge speed in step S220 is faster than that of step S240, i.e., a read speed with respect to the meta memory block BLK1 is faster than that with respect to a normal memory block. In step S250, a sensing operation is performed through the selected bit lines.

Figure 8:
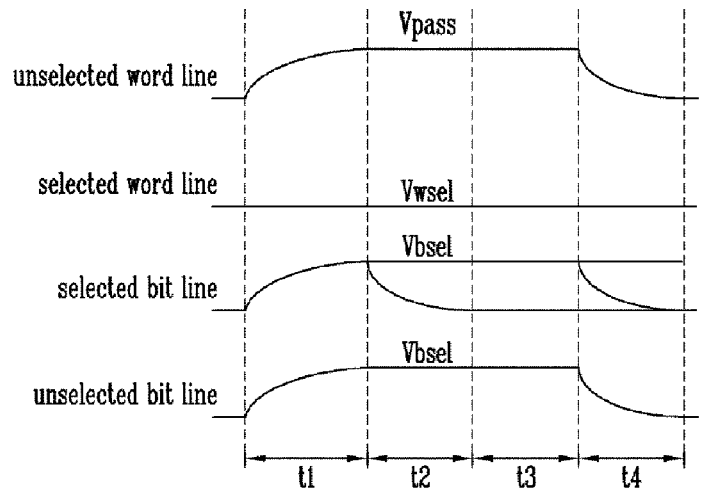
FIG. 8 is a timing diagram illustrating voltages when a read operation is performed on the meta memory block in FIG. 1.
Figure 9:
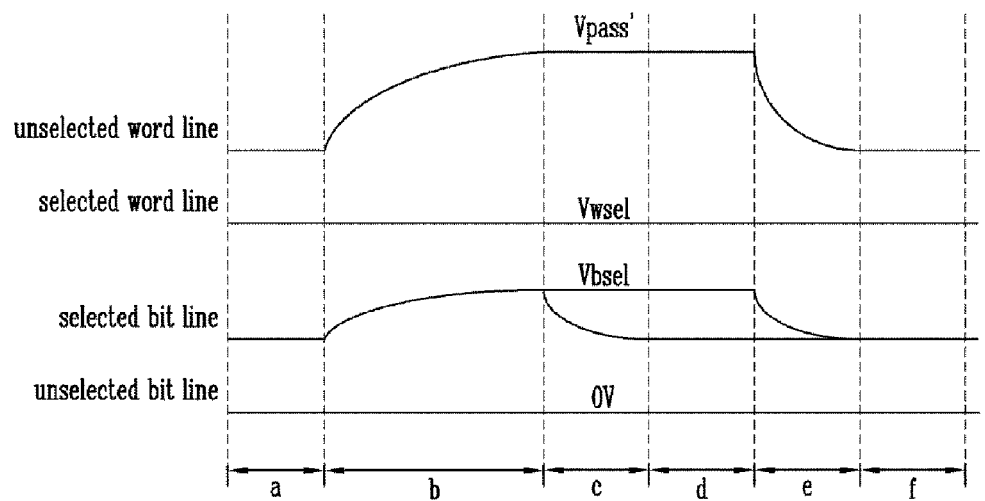
FIG. 9 is a timing diagram illustrating voltages when a read operation is performed on a normal memory block in FIG. 1.

FIG. 8 is a timing diagram illustrating voltages when a read operation is performed on the meta memory block BLK1 in FIG. 1. FIG. 9 is a timing diagram illustrating voltages when a read operation is performed on the normal memory block in FIG. 1.

First, referring to FIG. 8, during a first time interval t1, the low pass voltage Vpass starts to be applied to a unselected word line, the word line selection voltage Vwsel starts to be applied to a selected word line, and the bit line selection voltage Vbsel starts to be applied to a selected bit line and a unselected bit line.

Referring to FIG. 9, during an interval (a), the high voltage generator of the semiconductor memory device 100 (FIG. 1) is set up before a high pass voltage Vpass' is provided. Since the high pass voltage Vpass' is not used in a read operation with respect to the meta memory block BLK1, a set-up time of the high voltage generator is not required. The high pass voltage Vpass' is higher than the pass voltage Vpass. In at least one embodiment, the high pass voltage Vpass' is sufficient to turn on a memory cell regardless of whether the memory cell is in an erased state or a programmed state.

During an interval (b), the high pass voltage Vpass' starts to be applied to the unselected word line, the word line selection voltage Vwsel starts to be applied to the selected word line, the bit line selection voltage Vbsel starts to be applied to the selected bit line, and the reference voltage (e.g., 0V) starts to be applied to the unselected bit line.

During a read operation with respect to the meta memory block BLK1, the pass voltage Vpass applied to the unselected word line is a low voltage. Meanwhile, during a read operation with respect to the normal memory block, the pass voltage Vpass' applied to the unselected word line is a high voltage. A loading time taken for the high pass voltage Vpass' to reach a target voltage will be shorter than that for the low pass voltage Vpass to reach the target voltage.

During the read operation with respect to the meta memory block BLK1, the bit line selection voltage Vbsel is applied to the unselected bit line as well as to the selected bit line. Meanwhile, during a read operation with respect to the normal memory block, different voltages are applied to the selected bit line and the unselected bit line. The bit line selection voltage Vbsel provided during the read operation with respect to the meta memory block BLK1 may have a higher rising slop and/or a shorter loading time than those of the bit line selection voltage Vbsel provided during the read operation with respect to the normal memory block.

During a second time interval t2 and an interval (c) in FIGS. 8 and 9, respectively, the voltage Vbsel of the selected bit line is changed according to data stored in a selected memory cell. When the selected memory cell is in an erased state, the voltage Vbsel of the selected bit line is reduced. When the selected memory cell is in a programmed state, the voltage Vbsel of the selected bit line is maintained.

During a third time interval t3 and an internal (d) in FIGS. 8 and 9, respectively, a voltage of the selected bit line is sensed to discriminate data of the selected memory cell. During a fourth time interval t4 and an interval (e) in FIGS. 8 and 9, respectively, the voltages of the bit lines and the word lines are initialized (reset) in order to terminate the read operation.

Also, a read operation with respect to the normal memory block may require an additional time for initializing the high voltage generator, as illustrated in an interval (f) in FIG. 9.

According to at least one embodiment of the present invention, a fast speed of a read operation with respect to the meta memory block can be guaranteed.

Figure 11:
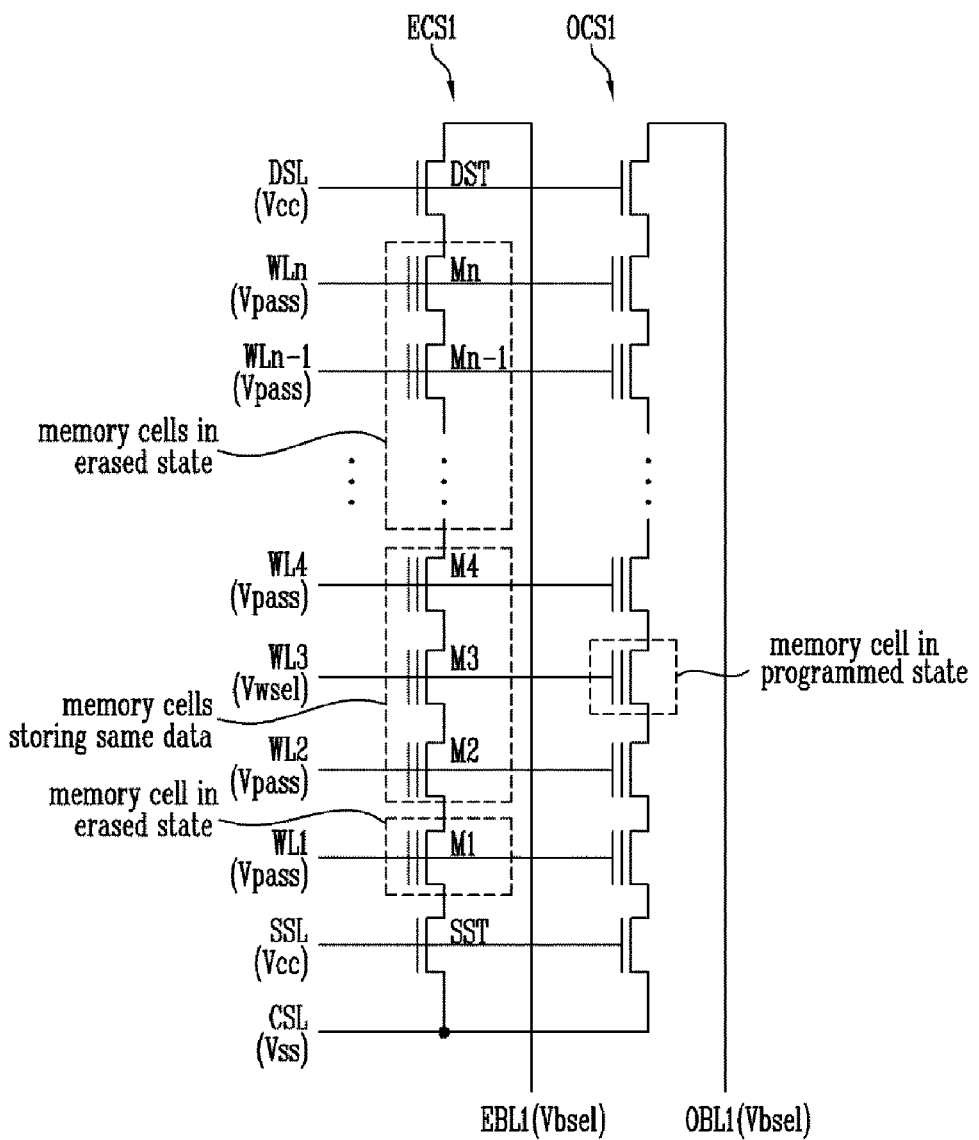
FIG. 11 is a view illustrating states of the memory cells included in the even string cell and the odd string cell when data is stored according to the exemplary embodiment of FIG. 10.

FIG. 10 is a conceptual view illustrating another exemplary embodiment of storing data in memory pages EP1~EPn and OP1~OPn included in the meta memory block BLK1. FIG. 11 is a view illustrating states of the memory cells included in the even string cell ECS1 and the odd string cell OCS1 when data is stored according to the exemplary embodiment of FIG. 10.

Referring to FIG. 10, the same data (i.e., duplicated data) as the data stored a third even memory page EP3 is stored in even memory pages EP2 and EP4 contiguous to the third even memory page EP3.

Subsequently, referring to FIG. 11, the same data is stored in the second to fourth memory cells M2~M4 among the memory cells of the even cell string ECS1. The first memory cell M1 and the fifth to nth memory cells M5~Mn remain empty. For example, the first memory cell M1 and the fifth to nth memory cells M5~Mn are in an erased state. The odd cell string OCS1 has at least one memory cell in a programmed state (e.g., the memory cell connected to WL3).

It is assumed that the second and fourth memory cells M2 and M4 are in an erased state, without storing the same data as that of the third memory cell M3. When the third memory cell M3 is in a programmed state, since the threshold voltage of the third memory cell M3 and threshold voltages of the second and fourth memory cells M2 and M4 are different, the threshold voltage of the third memory cell M3 may be gradually reduced. Data stored in the third memory cell M3 may be lost.

According to at least one embodiment of the present invention, the same data as that of the third memory cell M3 is stored in the memory cells M2 and M4 adjacent to the third memory cell M3 in the even cell string ECS1. Namely, the same data as that stored in the third even memory page EP3 may be stored in the even memory pages EP2 and EP4 (FIG. 10) adjacent to the third even memory page PE3 (FIG. 10). Thus, the threshold voltages of the memory cells M2, M3 and M4 are the same without causing the threshold voltage of the third memory cell M3 to be gradually reduced, whereby data retention characteristics of the third even memory page EP3 can be enhanced.

In an exemplary embodiment, as illustrated in FIG. 11, during a read operation, the word line selection voltage Vwsel may be applied to the selected word line WL3 and the pass voltage Vpass may be applied to the unselected word lines WL1, WL2, and WL4~WLn.

In at least another embodiment, unlike the case illustrated in FIG. 11, during the read operation, the word line selection voltage Vwsel may be applied to the second to fourth word lines WL2~WL4 and the pass voltage Vpass may be applied to the other word lines WL1 and WL5~WLn.

Figure 12:
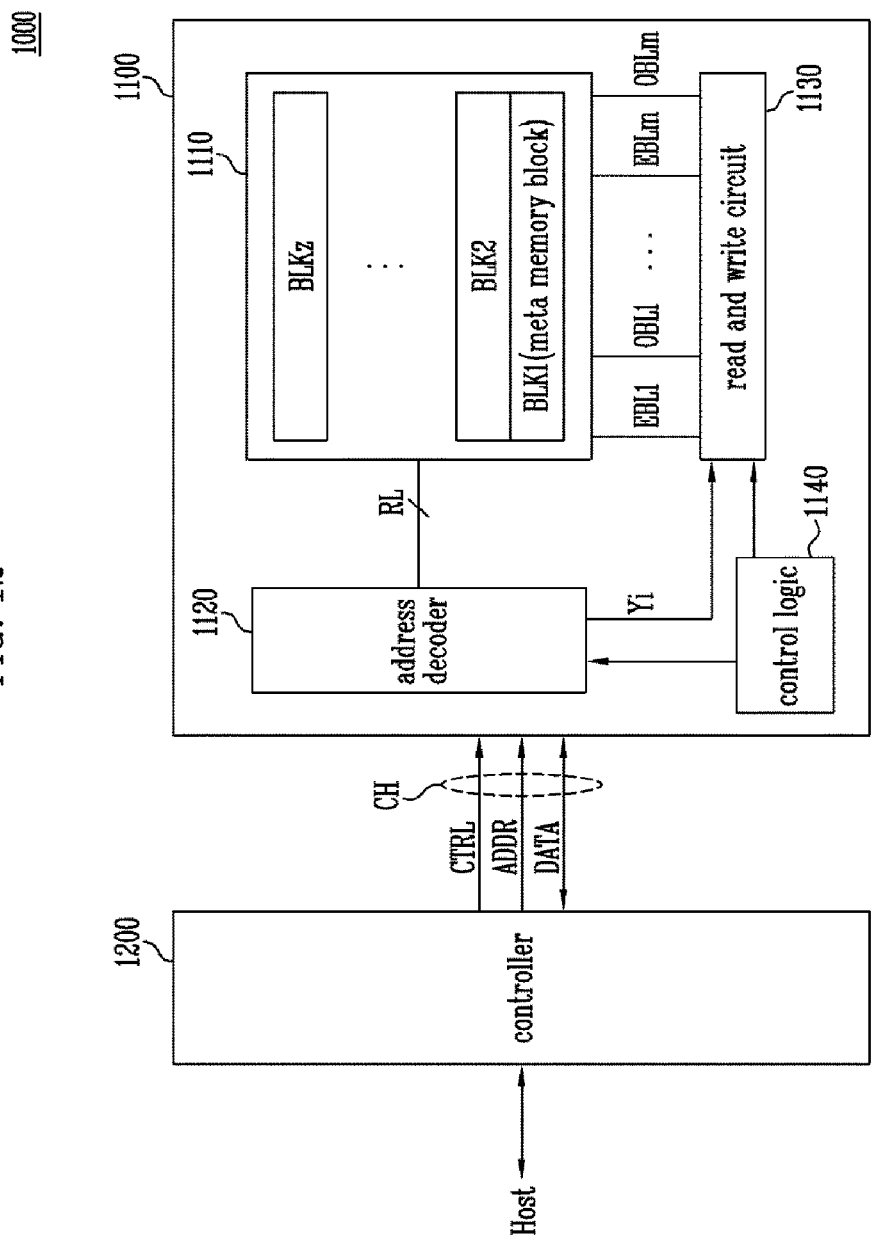
FIG. 12 is a block diagram of a memory system including the semiconductor memory device of FIG. 1.

FIG. 12 is a block diagram of a memory system 1000 including the semiconductor memory device 100 of FIG. 1.

Referring to FIG. 12, the memory system 1000 includes a semiconductor memory device 1100 and a controller 1200. The semiconductor memory device 1100 includes a memory cell array 1110, an address decoder 1120, a read and write circuit 1130, and a control logic 1140. The memory cell array 1110, the address decoder 1120, the read and write circuit 1130, and the control logic 1140 are configured to be the same as the memory cell array 110, the address decoder 120, the read and write circuit 130, and the control logic 140 illustrated in FIG. 1, respectively. Hereinafter, a repeated description will be omitted.

The controller 1200 is connected to a host and the semiconductor memory device 1100. The controller 1200 may be configured to provide a control signal CTRL and an address ADDR to the semiconductor memory device 1100 and exchange data DATA with the semiconductor memory device 1100. The control signal CTRL, the address ADDR, and the data DATA are transmitted through a channel CH.

The controller 1200 is configured to access the semiconductor memory device 1100 according to a request from the host or a request internally generated from the controller 1200. For example, the controller 1200 may be configured to control a read, program, and erase operation of the semiconductor memory device 1100. The controller 1200 may be configured to provide an interface between the semiconductor memory device 1100 and the host. The controller 1200 may be configured to execute firmware for controlling the semiconductor memory device 1100.

According to at least one embodiment of the present invention, the controller 1200 may use a first memory block BLK1 of the semiconductor memory device 1100 as a meta memory block. The controller 1200 may store data, e.g., meta data, required to be read at a fast speed in the meta memory block BLK1. In such a case, the meta memory block BLK1 may be a memory block that may be accessed by the controller 1200, rather than being a hidden memory block that cannot be accessed from outside.

As described above with reference to FIG. 6, the controller 1200 may manage the meta memory block BLK1. The controller 1200 may store meta data in the meta memory block BLK1 only in one memory page of even cell strings and leave the other remaining memory pages empty. The controller 1200 may maintain odd cell strings of the meta memory block BLK1 as a data non-storage region. Also, the controller 1200 may control the semiconductor memory device 1100 to perform programming on at least one memory cell of each of odd cell strings of the meta memory block BLK1. This programming may be performed as the controller 1200 transmits the control signal indicating programming, the address ADDR indicating memory cells to be programmed, and the corresponding data DATA (which in at least one embodiment includes dummy data) to the semiconductor memory device 1100.

Figure 13:
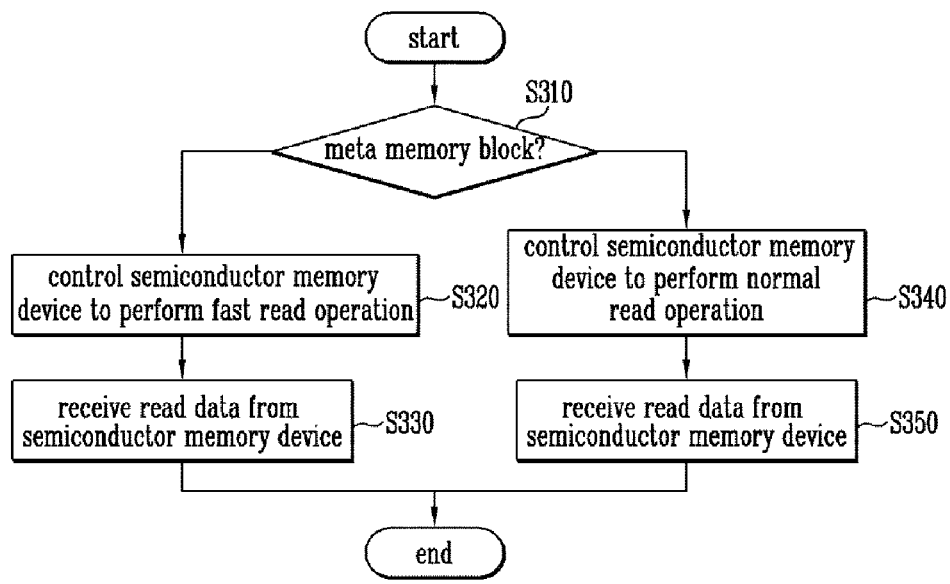
FIG. 13 is a flow chart illustrating a method of reading data stored in the semiconductor memory device by a controller of FIG. 12.

FIG. 13 is a flow chart illustrating a method of reading data stored in the semiconductor memory device 1100 by the controller 1200 of FIG. 12.

Referring to FIGS. 12 and 13, when a read request is generated in step S310, the controller 1200 discriminates whether or not the read request is a read request for the meta memory block BLK1. When the read request is a read request for the meta memory block BLK1, step S320 is performed. When the read request is not a read request for the meta memory block BLK1, step S340 is performed.

In step S320, the controller 1200 controls the semiconductor memory device 1100 to perform a fast read operation. The controller 1200 may provide a control signal CTRL for a fast read operation, together with the address ADDR indicating a selected memory page of the meta memory block BLK1, to the semiconductor memory device 1100. In response to the control of the controller 1200, the semiconductor memory device 1100 may precharge selected bit lines (e.g., EBL1~EBm in FIG. 2) and unselected bit lines (e.g., OBL1~OBm in FIG. 2) with the same voltage. Also, the semiconductor memory device 1100 may read data of the selected memory page of the meta memory block BLK1 through the selected bit lines.

In step S330, the controller 1200 may receive read data from the semiconductor memory device 1100.

In step S340, the controller 1200 controls the semiconductor memory device 1100 to perform a normal read operation. The controller 1200 may provide the control signal CTRL for the normal read operation, together with the address ADDR indicating a selected memory page of a normal memory block (e.g., one of BLK2 to BLKz), to the semiconductor memory device 1100. In response to the control of the controller 1100, the semiconductor memory device 1100 precharges selected bit lines with the bit line selection voltage Vbsel and unselected bit lines with the reference voltage. Also, the semiconductor memory device 1100 may read data of the selected memory page of the normal memory block through the selected bit lines.

In step S330, the controller 1200 receives read data from the semiconductor memory device 1100.

According to at least one embodiment of the present invention, the speed of the read operation with respect to the meta memory block can be increased.

In an exemplary embodiment, the controller 1200 includes components such as a processing unit, a random access memory (RAM), a host interface, and a memory interface. The processing unit controls operation of the controller 1200.

The RAM is used as at least one of an operation memory, a cache memory between the semiconductor memory device 1100 and the host, and a buffer memory between the semiconductor memory device 1100 and the host.

The host interface includes a protocol for exchanging data between the host and the controller 1200. In an exemplary embodiment, the controller 1200 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and the like. The memory interface is interfaced with the semiconductor memory device 1100. For example, the memory interface includes a NAND interface or a NOR interface.

The memory system 1000 may be configured to additionally include an error correction block. The error correction block is configured to detect an error of data read from the semiconductor memory device 1100 and correct it. In an exemplary embodiment, the error correction block may be provided as a component of the controller 1200. In another example, the error correction block may be provided as a component of the semiconductor memory device 1100.

The controller 1200 and the semiconductor memory device 1100 may be integrated into a single memory device. In an exemplary embodiment, the controller 1200 and the semiconductor memory device 1100 may be integrated into a single memory device to constitute a memory card. For example, the controller 1200 and the semiconductor memory device 1100 may be integrated into a single semiconductor device to constitute a PC card (personal computer memory card international association (PCMCIA), a compact flash (CF) card, a smart media card (SMC), a memory stick, a multimedia card (MMC, RS-MMC, MMCmicro), an SD card (SD, miniSD, microSD, SDHC), a universal flash storage (UFS), or the like.

The controller 1200 and the semiconductor memory device 1100 may be integrated into a single semiconductor device to constitute a semiconductor drive (or a solid state drive (SSD)). The semiconductor drive (SSD) includes a storage device configured to store data in a semiconductor memory. When the memory system 1000 is used as a semiconductor drive (SSD), an operation speed of the host connected to the memory system 1000 can be remarkably increased.

In at least one embodiment, the memory system 1000 is provided as one of various components of an electronic device such as one of a computer, a ultra mobile PC (UMPC), a work station, a net-book, a personal digital assistant (PDA), a portable computer, a Web tablet, a wireless phone, a mobile phone, a smart phone, an e-book, a portable multimedia player (PMP), a portable game machine, a navigation device, a black box, a digital camera, a 3D television, a digital audio recorder, a digital audio player, a digital picture recorder, a digital picture player, a digital video recorder, a digital video player, a device that is configured to transmit and receive information in an wireless environment, one of various electronic devices constituting a home network, one of various electronic devices constituting a computer network, one of various electronic devices constituting a telematics network, and one of various electronic devices constituting a radio-frequency identification (RFID) device or a computing system.

In an exemplary embodiment, the semiconductor memory device 1100 or the memory system 1000 may be in various forms of packages. For example, the semiconductor memory device 1100 or the memory system 1000 may be packaged and mounted in the form of a PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 14:
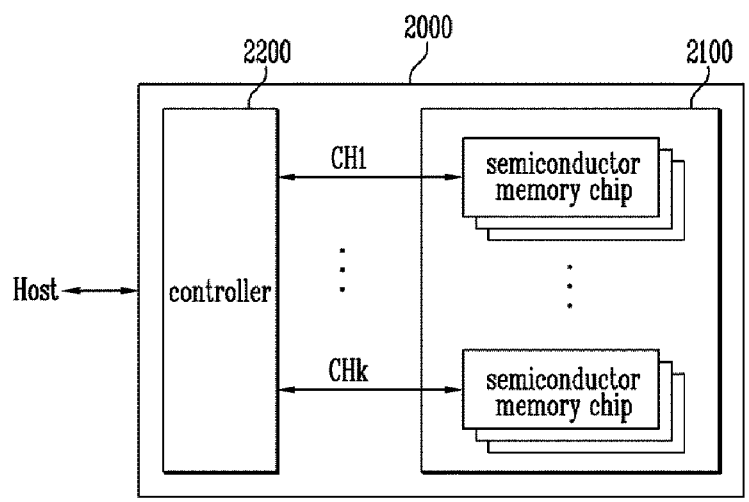
FIG. 14 is a block diagram of a memory system according to at least another embodiment of the present invention.

FIG. 14 is a block diagram of a memory system 2000 according to at least one embodiment of the present invention.

Referring to FIG. 14, the memory system 2000 includes a semiconductor memory device 2100 and a controller 2200. The semiconductor memory device 2100 is connected to the controller 2200 through first to kth channels CH1~CHk. The semiconductor memory device 2100 includes a plurality of semiconductor memory chips. The plurality of semiconductor memory chips are divided into a plurality of groups. The semiconductor memory chips in each group are configured to communicate with the controller 2200 through a single common channel. In FIG. 14, it is illustrated that the plurality of semiconductor memory chips communicate with the controller 2200 through the first to kth channels CH1~CHk.

Each semiconductor memory chip may be configured and operate like any one of the semiconductor memory device 100 described above with reference to FIG. 1 and the semiconductor memory device 1100 described above with reference to FIG. 12.

When power of the memory system 2000 is turned on, each semiconductor memory chip may read data stored in a meta memory block thereof and perform initialization based on the read data. According to at least one embodiment of the present invention, since the speed of the read operation with respect to the meta memory block is fast, a time required for the initialization operation can be shortened. Also, since a current consumed for the fast read operation is small, the semiconductor memory chips included in the semiconductor memory device 2100 can be simultaneously initialized.

In FIG. 14, it is described that the plurality of semiconductor memory chips in each group are connected to a single channel. However, it can be understood that the memory system 2000 may be modified such that a single semiconductor memory chip is connected to an individual channel.

Figure 15:
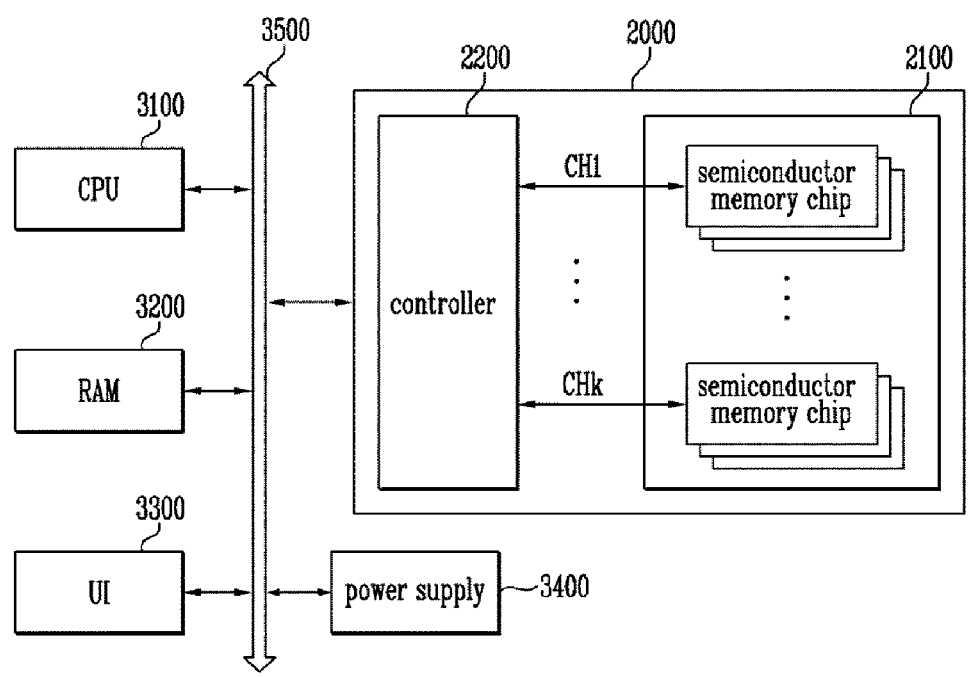
FIG. 15 is a block diagram of a computing system including the memory system described with reference to FIG. 14.

FIG. 15 is a block diagram of a computing system 3000 including the memory system 2000 described with reference to FIG. 14. With reference to FIG. 15, the computing system 3000 includes a central processing unit (CPU) 3100, a random access memory (RAM) 3200, a user interface 3300, a power supply 3400, a system bus 3500, and the memory system 2000.

The memory system 2000 is electrically connected to the CPU 3100, the RAM 3200, the user interface 3300, and the power supply 3400. Data provided through the user interface 3300 or processed by the CPU 3100 is stored in the memory system 2000.

In FIG. 15, the semiconductor memory device 2100 is illustrated to be connected to the system bus 3500 through the controller 2200. However, the semiconductor memory device 2100 may be configured to be directly connected to the system bus 3500. In some embodiments, the function of the controller 2200 may be performed by the CPU 3100. A function of a RAM included in the controller 2200 may be performed by the RAM 3200 of FIG. 15.

In FIG. 15, the memory system 2000 described above with reference to FIG. 14 is illustrated to be provided. However, the memory system 2000 may be replaced by the memory system 1000 described above with reference to FIG. 12. Exemplarily, the computing system 3000 may be configured to include all the memory systems 1000 and 2000 described above with reference to FIGS. 12 and 14.

According to at least one embodiment of the present invention, even bit lines and odd bit lines are precharged with the same voltage during a read operation with respect to the meta memory block. The precharge speed of the bit lines can be increased. Thus, the semiconductor memory device having an increased read operation speed is provided.

As described above, according to embodiments of the present invention, the semiconductor memory device having increased read operation speed, a memory system including the same, and an operating method thereof can be provided.

While embodiments of the present invention have been shown and described, it will be apparent to those skilled in the art that modifications and variations can be made without departing from the spirit and scope of the invention as defined by the appended claims.

What is claimed is:

1. A semiconductor memory device, comprising:
    first cell strings coupled to first bit lines;
    second cell strings coupled to second bit lines alternately arranged with the first bit lines, respectively; and
    a read and write circuit coupled to the first cell strings through the first bit lines and the second cell strings through the second bit lines, and configured to precharge the first bit lines and the second bit lines with a same voltage when a read operation is performed on memory cells storing data of the first cell strings, wherein the second cell strings are maintained as a data non-storage region, and at least one memory cell of each of the second cell strings is in a programmed state.

2. The semiconductor memory device of claim 1, wherein, in the read operation, the read and write circuit is configured to detect data of the memory cells of the first cell strings according to a change in voltages of the first bit lines.

3. The semiconductor memory device of claim 1, wherein the memory cells storing the data in the first cell strings are coupled to at least one word line, and
memory cells in the programmed state of the second cell strings are coupled to the at least one word line.

4. The semiconductor memory device of claim 3, wherein in response to a word line selection voltage applied to the at least one word line during the read operation,
each of the memory cells storing data in the first cell strings is configured to be turned on or turned off according to the corresponding data stored therein, and
the memory cells in the programmed state of the second cell strings are configured to be turned off.

5. The semiconductor memory device of claim 1, wherein the memory cells storing the data in the first cell strings are coupled to at least one first word line, and
the memory cells in the programmed state of the second cell strings are coupled to a second word line different from the at least one first word line.

6. The semiconductor memory device of claim 5, wherein memory cells of the first cell strings coupled to the second word line are in an erased state, and
in response to a pass voltage applied to the second word line during the read operation,
the memory cells of the first cell strings coupled to the second word line are configured to be turned on, and
the memory cells in the programmed state of the second cell strings are configured to be turned off.

7. The semiconductor memory device of claim 1, wherein the memory cells storing the data in the first cell strings are coupled to a single word line, and
memory cells of the first cell strings coupled to a word line adjacent to the single word line store a duplicate of the data.

8. A memory system, comprising:
a semiconductor memory device including
first cell strings coupled to first bit lines and second cell strings coupled to second bit lines alternately arranged with the first bit lines, respectively, and
a read and write circuit coupled to the first cell strings through the first bit lines and the second cell strings through the second bit lines, and configured to precharge the first bit lines and the second bit lines with a same voltage during a read operation performed on the memory cells storing data of the first cell strings; and
a controller configured to access data stored in the memory cells storing data of the first cell strings and to maintain the second cell strings as a data non-storage region,
wherein at least one memory cell of each of the second cell strings is in a programmed state.

9. The memory system of claim 8, wherein
the memory cells storing the data of the first cell strings are coupled to at least one word line, and
memory cells of the first cell strings coupled to remaining word lines are maintained to be empty.

10. The memory system of claim 9, wherein the memory cells in the programmed state of the second cell strings are coupled to the at least one word line.

11. The memory system of claim 9, wherein the memory cells in the programmed state of the second cell strings are coupled to at least one of the remaining word lines.

12. The memory system of claim 8, wherein
the first and second cell strings belong to a meta memory block of the semiconductor memory device, and
the data stored in the memory cells of the first cell strings includes meta data for managing operation of the semiconductor memory device.

13. The memory system of claim 12, wherein the at least one memory cell in the programmed state in each of the second cell strings stores dummy data.

14. A control method of a semiconductor memory device including first bit lines and second bit lines alternately arranged with the first bit lines, respectively, the method comprising:
storing data in memory cells of first cell strings coupled to the first bit lines;
programming at least one memory cell of each of second cell strings coupled to the second bit lines; and
precharging the first bit lines and the second bit lines with a same voltage in performing a read operation on memory cells of the first cell string coupled to a selected word line,
wherein the second cell strings are maintained as a data non-storage region.

15. The control method of claim 14, wherein the storing the data and the programming at least one memory cell of each of the second cell strings are performed in a test stage after the semiconductor memory device is manufactured.

16. The control method of claim 14, wherein the memory cells storing the data of the first cell strings are coupled to at least one word line, and memory cells of the first cell strings coupled to remaining word lines are maintained to be empty.

17. The control method of claim 16, wherein the programming comprises
programming memory cells of the second cell strings coupled to the at least one word line in the programmed state.

18. The control method of claim 16, wherein the programming comprises
programming memory cells of the second cell strings coupled to a word line different from the at least one word line in the programmed state.

19. The control method of claim 14, wherein memory cells storing the data of the first cell strings are coupled to a word line.

20. The control method of claim 19, further comprising:
applying a word line selection voltage to the word line;
applying a first pass voltage higher than the word line selection voltage to remaining word lines; and
detecting data of the memory cells storing the data of the first cell strings according to voltages of the first bit lines.

21. The control method of claim 20, wherein the first and second cell strings belong to a meta memory block of the semiconductor memory device which further includes a normal memory block, the method further comprising:
performing a read operation on a selected memory cell coupled to a selected bit line and a selected word line of the normal memory block by
precharging the selected bit line with a voltage different from voltages on bit lines adjacent to the selected bit line of the normal memory block,
applying a second pass voltage to unselected word lines of the normal memory block; and
detecting data of the selected memory cell according to a voltage of the selected bit line, wherein the second pass voltage is higher than the first pass voltage.

\* \* \* \* \*